United States Patent
Adlam

(10) Patent No.: US 9,025,301 B1
(45) Date of Patent: May 5, 2015

(54) WIRE FENCE FINGERPRINT SENSOR PACKAGE AND FABRICATION METHOD

(75) Inventor: Edwin Joseph Adlam, Phoenix, AZ (US)

(73) Assignee: Amkor Technology, Inc.

( * ) Notice: Subject to any disclaimer, the term of this patent is extended or adjusted under 35 U.S.C. 154(b) by 395 days.

(21) Appl. No.: 13/459,661

(22) Filed: Apr. 30, 2012

(51) Int. Cl.
*H05F 3/02* (2006.01)
*H05K 9/00* (2006.01)
*G01D 5/24* (2006.01)

(52) U.S. Cl.
CPC ............. *H05F 3/02* (2013.01); *H05K 9/0067* (2013.01); *G01D 5/24* (2013.01)

(58) Field of Classification Search
CPC ............ H05F 3/02; H05K 9/0067; G01D 5/24
USPC ....................................... 361/220; 174/152 E
See application file for complete search history.

(56) References Cited

U.S. PATENT DOCUMENTS

| | | | |
|---|---|---|---|
| 5,862,248 A * | 1/1999 | Salatino et al. | 382/124 |
| 6,246,566 B1 * | 6/2001 | Glenn | 361/220 |
| 6,900,644 B2 * | 5/2005 | Chou et al. | 324/661 |
| 7,576,414 B2 * | 8/2009 | Huang et al. | 257/630 |
| 7,733,659 B2 * | 6/2010 | Snider et al. | 361/752 |
| 7,859,116 B1 | 12/2010 | Kelly et al. | |
| 7,898,066 B1 | 3/2011 | Scanlan et al. | |
| 8,012,868 B1 * | 9/2011 | Naval et al. | 438/617 |

OTHER PUBLICATIONS

Bolognia et al., "Fingerprint Sensor Package and Method," U.S. Appl. No. 12/848,833, filed Aug. 2, 2010.

* cited by examiner

*Primary Examiner* — Zeev V Kitov
(74) *Attorney, Agent, or Firm* — McAndrews, Held & Malloy, Ltd.

(57) ABSTRACT

A wire fence fingerprint sensor package includes a substrate, a fingerprint sensor mounted to the substrate, and a wire fence mounted to the substrate adjacent the fingerprint sensor. During use, the wire fence is electrically connected to a reference voltage source, e.g., ground. Thus, the wire fence discharges electrostatic discharge (ESD) from a finger contacting the wire fence fingerprint sensor package. The wire fence is formed of low cost wire loops that are fabricated, for example, using a standard and inexpensive wire bonding apparatus. Accordingly, the wire fence fingerprint sensor package is fabricated at a minimal cost.

20 Claims, 2 Drawing Sheets

WIRE FENCE FINGERPRINT SENSOR PACKAGE AND FABRICATION METHOD

TECHNICAL FIELD

The present application relates to the field of electronics, and more particularly, to methods of forming electronic component packages and related structures.

BACKGROUND

For user verification and other purposes, many devices such as portable computers and cellular telephones include a fingerprint sensor. A fingerprint sensor, sometimes called a biometric sensor, senses a fingerprint of a finger place on the fingerprint sensor. The obtained fingerprint is compared to an authorized user's stored fingerprint. If there is a match, the user is verified.

The finger placed on the fingerprint sensor may have an electrostatic charge. As the finger nears or contacts the fingerprint sensor, this electrostatic charge is discharged as an electrostatic discharge (ESD).

To prevent the ESD from damaging the fingerprint sensor, a grounded metal bezel is mounted near the fingerprint sensor. The grounded metal bezel discharges the ESD from the finger contacting the fingerprint sensor. However, the metal bezel is expensive, costly to attach, and results in assembly yield loss due to mold flash on the metal bezel.

BRIEF DESCRIPTION OF THE DRAWINGS

In the following description, the same or similar elements are labeled with the same or similar reference numbers.

DETAILED DESCRIPTION

Figure 1:
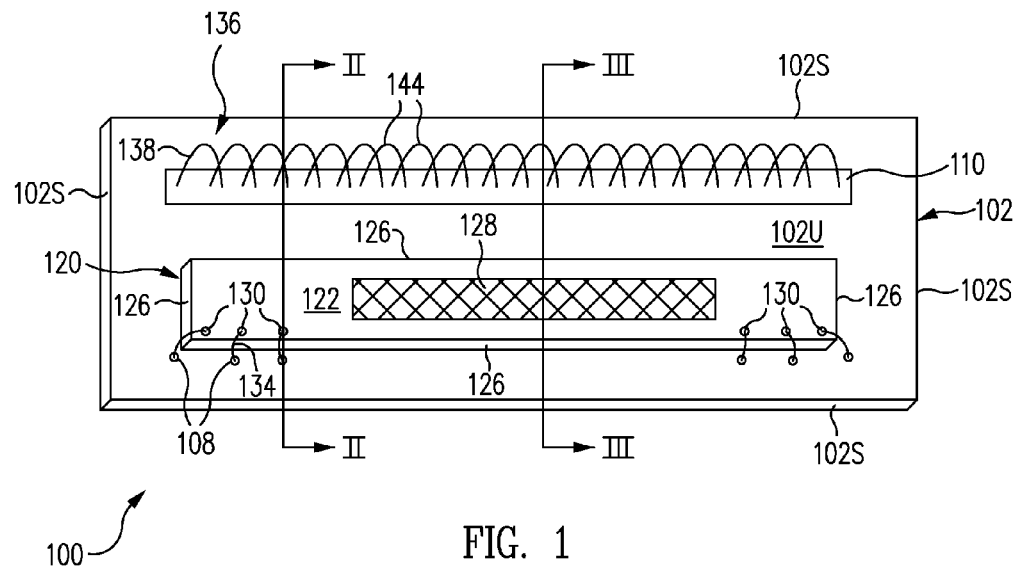
FIG. 1 is top plan view of a wire fence fingerprint sensor package in accordance with one embodiment.
Figure 2:
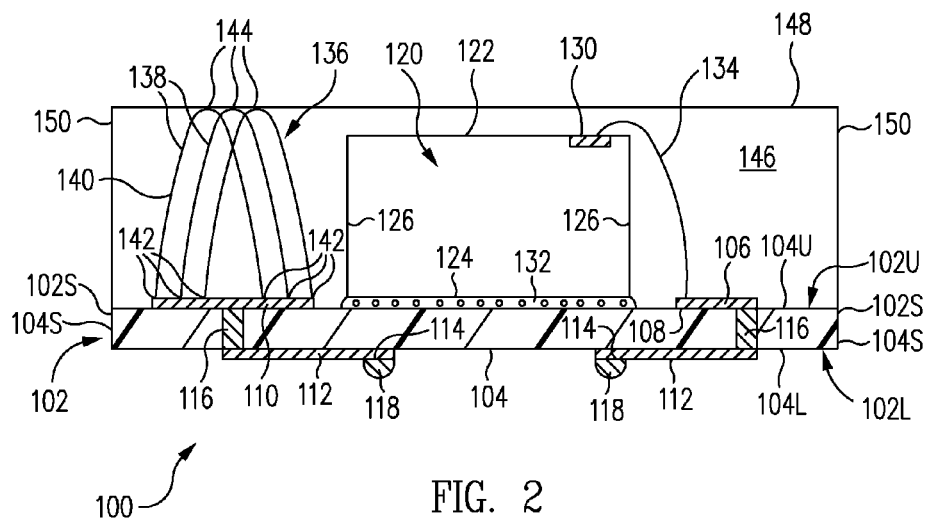
FIG. 2 is a cross sectional view of the wire fence fingerprint sensor package of FIG. 1 along the line II-II in accordance with one embodiment.
Figure 3:
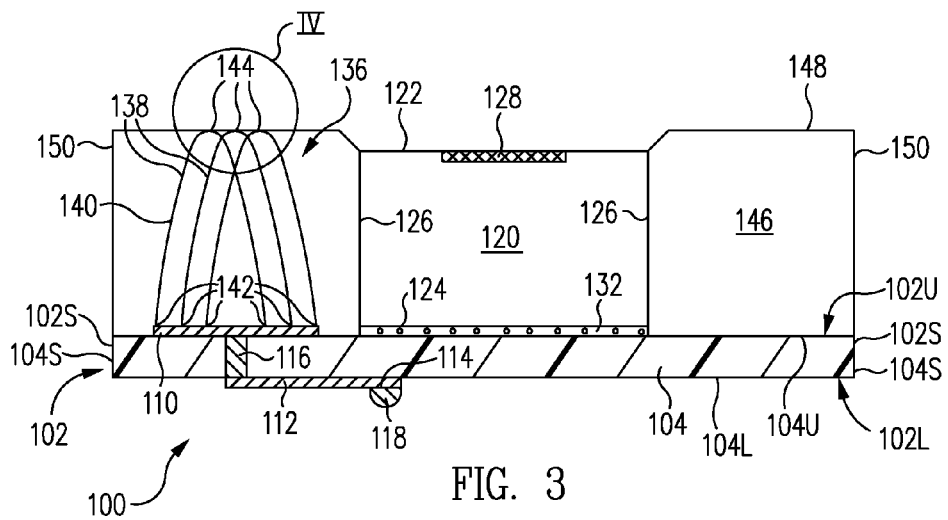
FIG. 3 is a cross sectional view of the wire fence fingerprint sensor package of FIG. 1 along the line III-III in accordance with one embodiment.

As an overview and in accordance with one embodiment, referring to FIGS. 1, 2, and 3 together, a wire fence fingerprint sensor package 100 includes a substrate 102, a fingerprint sensor 120 mounted to substrate 102, and a wire fence 136 mounted to substrate 102 adjacent fingerprint sensor 120.

During use, wire fence 136 is electrically connected to a reference voltage source, e.g., ground. Thus, wire fence 136 discharges electrostatic discharge (ESD) from a finger contacting wire fence fingerprint sensor package 100.

Wire fence 136 is formed of low cost wire loops 138 that are fabricated, for example, using a standard and inexpensive wire bonding apparatus. Accordingly, wire fence fingerprint sensor package 100 is fabricated at a minimal cost.

Now in more detail, FIG. 1 is top plan view of a wire fence fingerprint sensor package 100 in accordance with one embodiment. FIG. 2 is a cross sectional view of wire fence fingerprint sensor package 100 of FIG. 1 along the line II-II in accordance with one embodiment. FIG. 3 is a cross sectional view of wire fence fingerprint sensor package 100 of FIG. 1 along the line III-III in accordance with one embodiment. Referring now to FIGS. 1, 2, and 3 together, wire fence fingerprint sensor package 100, sometimes called an electronic component package, includes a substrate 102.

Substrate 102 includes a substrate core 104 including an upper, e.g., first, surface 104U and an opposite lower, e.g., second, surface 104L. Substrate core 104 further includes sides 104S extending perpendicularly between upper surface 104U and lower surface 104L. Substrate core 104 is a dielectric material such as laminate, ceramic, printed circuit board material, or other dielectric material.

Although the terms parallel, perpendicular, coplanar and similar terms are used herein, it is to be understood that the described features may not be exactly parallel, perpendicular, or coplanar, but only substantially parallel, perpendicular, or coplanar to within accepted manufacturing tolerances.

Formed on upper surface 104U of substrate core 104 are electrically conductive upper, e.g., first, traces 106, e.g., formed of copper. Upper traces 106 include terminals 108, sometimes called bond fingers.

Further, formed on upper surface 104U of substrate core 104 are one or more electrically conductive ground wire fence terminals 110, e.g., formed of copper.

Formed on lower surface 104L of substrate core 104 are lower, e.g., second, traces 112. Lower traces 112 including electrically conductive lands 114.

Lower traces 112 are electrically connected to upper traces 106 and wire fence terminals 110 by electrically conductive vias 116 extending through substrate core 104 between upper surface 104U and lower surface 104L.

Although not illustrated, substrate 102 can include dielectric solder masks on upper surface 104U and lower surface 104L. For example, the upper solder mask protects, i.e., covers, first portions of upper traces 106 while exposing second portions, e.g., terminals 108, of upper traces 106 and exposing wire fence terminals 110. The lower solder mask protects, i.e., covers, first portions of lower traces 112 while exposing second portions, e.g., lands 114, of lower traces 112. The upper and lower solder masks are optional, and in one embodiment, are not formed.

Generally, substrate 102 includes an upper, e.g., first, surface 102U and an opposite lower, e.g., second, surface 102L. Upper surface 102U is defined by the upper solder mask, by upper surface 104U of substrate core 104, and/or by any other structure which forms upper surface 102U of substrate 102. Similarly, lower surface 102L is defined by the lower solder mask, by lower surface 104L of substrate core 104, and/or by any other structure which forms lower surface 102L of substrate 102.

Substrate 102 further includes sides 102S extending perpendicularly between upper surface 102U and lower surface 102L.

Although a particular electrically conductive pathway between upper traces 106/wire fence terminals 110 and lower traces 112 is described above, other electrically conductive pathways can be formed. For example, contact metallizations can be formed between the various electrical conductors.

Further, instead of straight though vias 116, in one embodiment, a multilayer substrate includes a plurality of vias and/or internal traces that form the electrical interconnection between upper traces 106/wire fence terminals 110 and lower traces 112.

In this embodiment, interconnection balls 118, e.g., lead free solder balls, are formed on lands 114 to provide a Ball Grid Array (BGA). In another embodiment, interconnection balls 118 are not formed and lands 114 are distributed in an array thus forming a Land Grid Array (LGA). However, in other embodiment, other package configurations other than a LGA and a BGA are used. For example, a lead frame configuration is used.

Wire fence fingerprint sensor package 100 further includes a fingerprint sensor 120, sometimes called a sensor die. Fingerprint sensors are well known to those of skill in the art, accordingly, only a brief description of fingerprint sensor 120 is provided below.

Fingerprint sensor 120 includes an active surface 122, an opposite inactive surface 124, and sides 126 extending perpendicularly between active surface 122 and inactive surface 124.

Fingerprint sensor 120 further includes a sensing element 128 and bond pads 130 on active surface 122. Sensing element 128, e.g., fine pitch metal patterns, senses fingerprints placed upon fingerprint sensor 120. Bond pads 130 are electrically connected to the internal circuitry of fingerprint sensor 120.

Inactive surface 124 of fingerprint sensor 120 is mounted to upper surface 102U of substrate 102 with an adhesive 132. Bond pads 130 are electrically connected to terminals 108 of upper traces 106 by electrically conductive bond wires 134.

An electrically conductive wire fence 136 is formed on wire fence terminals 110. Wire fence 136 includes a plurality of wire loops 138. Wire loops 138 are formed of individual wires 140. Wires 140 are formed of electrically conductive material such as copper.

Generally, each wire 140 is attached at a first terminal end 142, extends upwards to an apex 144, and then extends downwards from apex 142 to a second terminal end 142 to form wire loops 138. Terminal ends 142 are bonded to wire fence terminals 110. Apex 144 is the highest point of wire loops 138 and generally of wire fence 136.

In one embodiment, a wire bonding apparatus is used to form wire fence 136. Illustratively, the wire bonding apparatus bonds a first terminal end 142 of a wire 140 to wire fence terminal 110, arcs the wire 140 through apex 144, and bonds a second terminal end 142 of the wire 140 to a wire fence terminal 110 and breaks the wire 140 there. Wire bonding is a low cost manufacturing technique and thus wire fence 136 is fabricated at minimal cost.

A package body 146, e.g., mold compound, epoxy or other dielectric material, is formed around fingerprint sensor 120 and wire fence 136. Package body 146 is not illustrated in FIG. 1 to allow visualization of features that would be covered and obscured with package body 146.

More particularly, package body 146 encapsulates, sometimes called encloses, covers or encases, upper surface 102U of substrate 102, wire fence 136, and sides 126 of fingerprint sensor 120.

Further, package body 146 entirely covers active surface 122 of fingerprint sensor 120 where bond pads 130 are formed to allow encapsulation and protection of bond wires 134 as illustrated in FIG. 2. However, as illustrated in FIG. 3, package body 146 exposes some or all of active surface 122 at sensing element 128, i.e., sensing element 128 is exposed from package body 146. In yet other embodiments, fingerprint sensor 120 is entirely enclosed in or entirely exposed from package body 146.

As illustrated in FIG. 1, wire fence 136 is directly adjacent and extends the length of fingerprint sensor 120. However, in other embodiments, wire fence 136 is shorter or longer than fingerprint sensor 120. For example, wire fence 136 is formed directly adjacent sensing element 128 only. In other embodiments, wire fence 136 is broken up into a plurality of discrete segments.

Apexes 144 of wire fence 136 are at a height above upper surface 102U of substrate 102 greater than or equal to a height of active surface 122 of fingerprint sensor 120 above upper surface 102U of substrate 102. As discussed further below, by having wire fence 136 extend to a height greater than or equal to the height of sensing element 128, a finger placed upon sensing element 128 also contacts wire fence 136 allowing for discharge of ESD from the finger. However, in another embodiment, wire fence 136 can be slightly lower than sensing element 128.

In one embodiment, the lower traces 112 connected to wire fence terminals 110, and thus to wire fence 136, are ground traces. More particularly, during operation, the lower traces 112 connected to wire fence terminals 110 are connected to a reference voltage source, e.g., ground. For example, the respective interconnection balls 118 are electrically connected to a reference voltage source, e.g., ground. In this manner, wire fence terminals 110 are ground terminals during operation of wire fence fingerprint sensor package 100.

Accordingly, wire fence 136 is electrically connected to the reference voltage source, e.g., ground. Thus, wire fence 136 discharges electrostatic discharge (ESD) from a finger contacting wire fence fingerprint sensor package 100.

The wire fence 136 is formed of low cost wire loops 138 that are fabricated, for example, using a standard and inexpensive wire bonding apparatus. Accordingly, wire fence fingerprint sensor package 100 is fabricated at a minimal cost.

Figure 4:
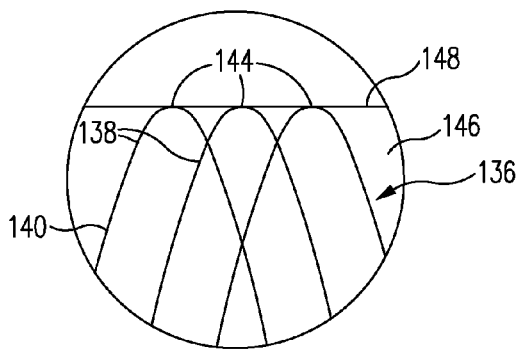
FIG. 4 is an enlarged cross sectional view of a region IV of the wire fence fingerprint sensor package of FIG. 3 in accordance with one embodiment.

FIG. 4 is an enlarged cross sectional view of a region IV of wire fence fingerprint sensor package 100 of FIG. 3 in accordance with one embodiment. Referring now to FIGS. 3 and 4 together, package body 146 includes a principal surface 148 and sides 150. Principal surface 148 is the uppermost surface of package body 146 and is parallel to upper surface 102U of substrate 102.

Sides 150 extend from upper surface 102U of substrate 102 to principal surface 148. In one embodiment, sides 150 are parallel and coplanar to sides 102S of substrate 102 and perpendicular to principal surface 148. In another embodiment, sides 150 slant inwards from upper surface 102U to principal surface 148 and thus are angled relative to principal surface 148.

As illustrated in FIGS. 3 and 4, apexes 144 of wire fence 136 are located at principal surface 148 and thus exposed from package body 146. In one embodiment, principal surface 148 may be etched, e.g., laser ablated, chemically etched, physically etched, or etched otherwise, to insure that apexes 144 are exposed.

Figure 5:
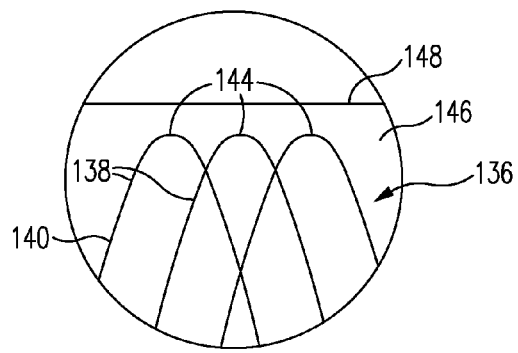
FIGS. 5, 6, 7 are enlarged cross-sectional views of the region IV of the wire fence fingerprint sensor package of FIG. 3 in accordance with various other embodiments.

FIG. 5 is an enlarged cross-sectional view of region IV of wire fence fingerprint sensor package 100 of FIG. 3 in accordance with another embodiment. As illustrated in FIG. 5, apexes 144 of wire fence 136 are below principal surface 148 in accordance with this embodiment.

More particularly, wire fence 136 is entirely enclosed and not exposed from package body 146. Depending upon the thickness of package body 146 above wire fence 136, discharge of ESD to wire fence 136 through package body 146 still occurs.

Figure 6:
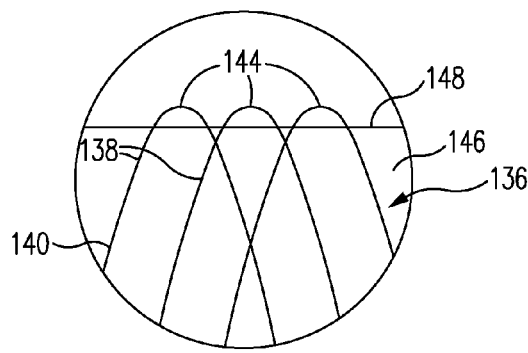

FIG. 6 is an enlarged cross-sectional view of region IV of wire fence fingerprint sensor package 100 of FIG. 3 in accordance with another embodiment. As illustrated in FIG. 6, apexes 144 of wire fence 136 are above principal surface 148 in accordance with this embodiment.

More particularly, wire fence 136 protrudes from package body 146. In one embodiment, package body 146 is laser ablated or otherwise selectively removed without removal of wire fence 136. This leaves wire fence 136, and specifically apexes 144, protruding above and exposed from principal surface 148.

Figure 7:
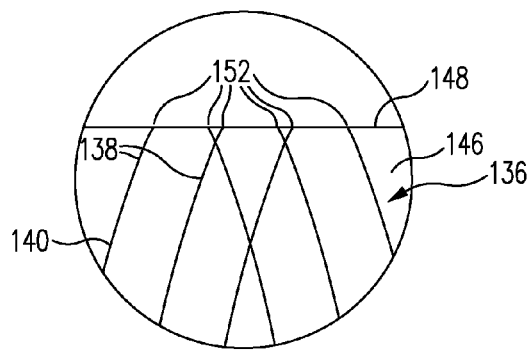

FIG. 7 is an enlarged cross-sectional view of region IV of wire fence fingerprint sensor package 100 of FIG. 3 in accordance with another embodiment. As illustrated in FIG. 7, apexes 144 of wire fence 136 have been removed in accordance with this embodiment.

More particularly, wire fence 136 and principal surface 148 have been ground down, e.g., using a mechanical grinding apparatus. This removes principal surface 148 as well as apexes 144 of wire fence 136. Wire fence 136 thus terminates in wire fence ends 152. Wire fence ends 152 are the exposed ends of wires 140. Wire fence ends 152 are parallel and coplanar to principal surface 148. In this manner, exposure of wire fence 136 from package body 146 is insured.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A structure comprising:
a package substrate comprising a first substrate surface and a second substrate surface opposite the first substrate surface;
a fingerprint sensor die comprising a first die surface, a second die surface opposite the first die surface, and a plurality of side die surfaces connecting the first die surface and the second die surface, wherein the second die surface is coupled to the first substrate surface; and
a wire fence separate from the fingerprint sensor die and coupled to the first substrate surface at a position adjacent to at least one of the plurality of side die surfaces, where the wire fence provides electrostatic discharge protection for the fingerprint sensor die.

2. The structure of claim 1 wherein:
the first die surface comprises an active die surface comprising a sensing element; and
the second die surface comprises an inactive die surface.

3. The structure of claim 1, wherein the wire fence comprises wire-bonded wire loops that extend from the first substrate surface past the first die surface.

4. The structure of claim 2 wherein:
the fingerprint sensor die comprises bond pads coupled to the active die surface;
the substrate comprises terminals; and
the structure comprises bond wires coupling the bond pads to the terminals.

5. The structure of claim 1 wherein:
the first substrate surface comprises at least one wire fence terminal; and
the wire fence is directly connected to the at least one wire fence terminal but not to the fingerprint sensor die.

6. The structure of claim 1 wherein the wire fence comprises a plurality of arch-shaped wire loops.

7. The structure of claim 6 wherein each of the plurality of arch-shaped wire loops comprises a single independent wire.

8. The structure of claim 7 wherein each of the single independent wires comprises:
a first terminal end coupled to the substrate;
an arch apex; and
a second terminal end coupled to the substrate.

9. The structure of claim 1, wherein the wire fence is adjacent to at least one of the plurality of side die surfaces but not to all of the side die surfaces.

10. The structure of claim 9, wherein the wire fence is adjacent to only one of the side die surfaces.

11. A structure comprising:
a molded package body;
a fingerprint sensor die at least partially enclosed within the molded package body, a sensing element of the fingerprint sensor die being exposed from the molded package body; and
a wire fence enclosed within the molded package body that provides electrostatic discharge protection for the fingerprint sensor die, where the wire fence is adjacent to but not directly connected to the fingerprint sensor die.

12. The structure of claim 11, wherein the molded package body comprises:
a first surface coupled to a package substrate; and
a principal surface opposite the first surface,
wherein an apex of an arch-shaped wire loop of the wire fence is located at the principal surface.

13. The structure of claim 12 wherein the apex is exposed from the principal surface.

14. The structure of claim 11 wherein the molded package body comprises:
a first surface coupled to a package substrate; and
a principal surface opposite the first surface, wherein an apex of a wire loop of the wire fence is located below the principal surface.

15. The structure of claim 14 wherein the wire fence is entirely enclosed within the package body.

16. The structure of claim 11 wherein the package body comprises:
a first surface coupled to a package substrate; and
a principal surface opposite the first surface,
wherein an apex of a wire loop of the wire fence is located above the principal surface.

17. The structure of claim 11 wherein the package body comprises:
a first surface coupled to a package substrate; and
a principal surface opposite the first surface,
wherein the wire fence comprises a wire comprising a first terminal end attached to the package substrate and a second terminal end exposed at the principal surface, the second terminal end of the wire being parallel to and coplanar with the principal surface.

18. A method comprising:
coupling a first die surface of a fingerprint sensor die to a first substrate surface of a package substrate, where the fingerprint sensor die comprises the first die surface, a second die surface opposite the first die surface, and a plurality of side die surfaces connecting the first die surface and the second die surface;
coupling a wire fence to the first substrate surface at a position adjacent to at least one of the plurality of side die surfaces, where the wire fence provides electrostatic discharge protection for the fingerprint sensor die; and
enclosing the wire fence in a molded package body.

19. The method of claim 18 further comprising removing a portion of the molded package body to expose the wire fence.

20. The method of claim 18, wherein said coupling a wire fence comprises coupling the wire fence to the first substrate surface at a position adjacent to at least one of the plurality of side die surfaces but not all of the plurality of side die surfaces.

* * * * *